(12) United States Patent
Solki et al.

(10) Patent No.: US 9,337,820 B1
(45) Date of Patent: May 10, 2016

(54) PULSE WIDTH RECOVERY IN CLOCK DIVIDERS

(71) Applicant: QUALCOMM Incorporated, San Diego, CA (US)

(72) Inventors: Shahin Solki, San Diego, CA (US); Dipti Ranjan Pal, San Diego, CA (US); Paul Ivan Penzes, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/629,460

(22) Filed: Feb. 23, 2015

(51) Int. Cl.
*H03L 7/00* (2006.01)
*H03K 5/156* (2006.01)
*H03K 5/15* (2006.01)

(52) U.S. Cl.
CPC ............ *H03K 5/1565* (2013.01); *H03K 5/1504* (2013.01)

(58) Field of Classification Search
USPC .......................................... 327/144, 152, 175
See application file for complete search history.

(56) References Cited

U.S. PATENT DOCUMENTS

| | | | | |
|---|---|---|---|---|
| 5,652,536 A * | 7/1997 | Nookala | ................... | G06F 1/08 326/46 |
| 6,639,441 B2 * | 10/2003 | Ono | ..................... | H03K 5/1534 327/161 |
| 6,748,408 B1 * | 6/2004 | Bredin | ..................... | G06F 7/68 708/271 |
| 6,882,206 B2 * | 4/2005 | Lawler | ................... | H03K 5/135 327/291 |
| 6,918,050 B2 | 7/2005 | Yoshikawa et al. | | |
| 7,675,336 B1 * | 3/2010 | Foo | ...................... | H03K 5/1565 327/115 |
| 8,269,530 B2 * | 9/2012 | Tao | .................... | H03K 5/00006 327/116 |
| 8,786,329 B1 | 7/2014 | Terrovitis | | |
| 8,988,121 B2 * | 3/2015 | Terrovitis | ................ | H03L 7/08 327/156 |
| 2002/0008558 A1 * | 1/2002 | Okuda | ................. | G11C 7/1051 327/175 |
| 2009/0058483 A1 * | 3/2009 | Shin | ..................... | H03K 5/1565 327/175 |
| 2010/0102891 A1 * | 4/2010 | Nissar | .................. | H03K 3/0315 331/57 |
| 2012/0081163 A1 * | 4/2012 | Hesen | .................... | H03K 21/08 327/175 |

* cited by examiner

*Primary Examiner* — Adam Houston
(74) *Attorney, Agent, or Firm* — Arent Fox LLP

(57) ABSTRACT

A duty cycle adjustment apparatus includes a duty cycle adjustment determination module configured to determine an adjustment to a duty cycle of a clock signal, and includes a clock delay module configured to receive the clock signal, to delay the clock signal through first and second delay stage modules (with a first and a second plurality of delay paths, respectively) based on the duty cycle adjustment determined by the duty cycle adjustment determination module, and to output the delayed clock signal. The second plurality of delay paths have a greater delay difference between each of the corresponding delay paths than the first plurality of delay paths. The apparatus further includes a duty cycle adjustment module configured to receive the clock signal and the delayed clock signal, to adjust the duty cycle of the clock signal based on the delayed clock signal, and to output a duty cycle adjusted clock signal.

30 Claims, 4 Drawing Sheets

PULSE WIDTH RECOVERY IN CLOCK DIVIDERS

BACKGROUND

1. Field

The present disclosure relates generally to pulse width recovery, and more particularly, to pulse width recovery in clock dividers.

2. Background

In a system on a chip (SoC)/integrated circuit (IC), a clock divider is often used to generate lower frequency clock signals from an existing higher frequency clock signal. With some divider values (e.g., integer divider values), a balanced duty cycle (e.g., 50%) may be maintained. However, for some divider values (e.g., fractional divider values), the duty cycle may be reduced, which reduces a pulse width of the divided clock signal. The reduced pulse width may require design changes to speed up the IC/SoC and/or to reduce a clock frequency provided to the IC/SoC. Methods and apparatuses are therefore needed for restoring a balanced duty cycle to a divided clock signal.

SUMMARY

In an aspect of the disclosure, a duty cycle adjustment apparatus of an IC includes a duty cycle adjustment determination module configured to determine an adjustment to a duty cycle of a clock signal. The duty cycle adjustment apparatus further includes a clock delay module configured to receive the clock signal, to delay the clock signal through a first delay stage module and a second delay stage module based on the duty cycle adjustment determined by the duty cycle adjustment determination module, and to output the delayed clock signal. The first delay stage module includes a first plurality of delay paths. The second delay stage module includes a second plurality of delay paths. The second plurality of delay paths have a greater delay difference between each of the corresponding delay paths than the first plurality of delay paths. The duty cycle adjustment apparatus further includes a duty cycle adjustment module configured to receive the clock signal and the delayed clock signal, to adjust the duty cycle of the clock signal based on the delayed clock signal, and to output a duty cycle adjusted clock signal.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As discussed supra, in an IC/SoC, a clock divider is often used to generate lower frequency clock signals from an existing higher frequency clock signal. Typically, the existing higher frequency clock signal has a duty cycle of approximately 50%. With integer divider values, a balanced duty cycle (e.g., 50%) may be maintained. However, for fractional divider values, the duty cycle of the divided clock signal may be reduced with respect to the clock signal. Reducing the duty cycle of the divided clock signal reduces a pulse width (also referred to as pulse duration) of the divided clock signal. The pulse width reduction adds to clock uncertainty on top of clock tree jitter and phase-locked loop (PLL) jitter. With an increase in clock uncertainty, design changes may be needed to speed up the IC/SoC and/or to reduce a clock frequency provided to the IC/SoC. Clock uncertainty increase is discussed infra with respect to FIG. 1.

Figure 1:
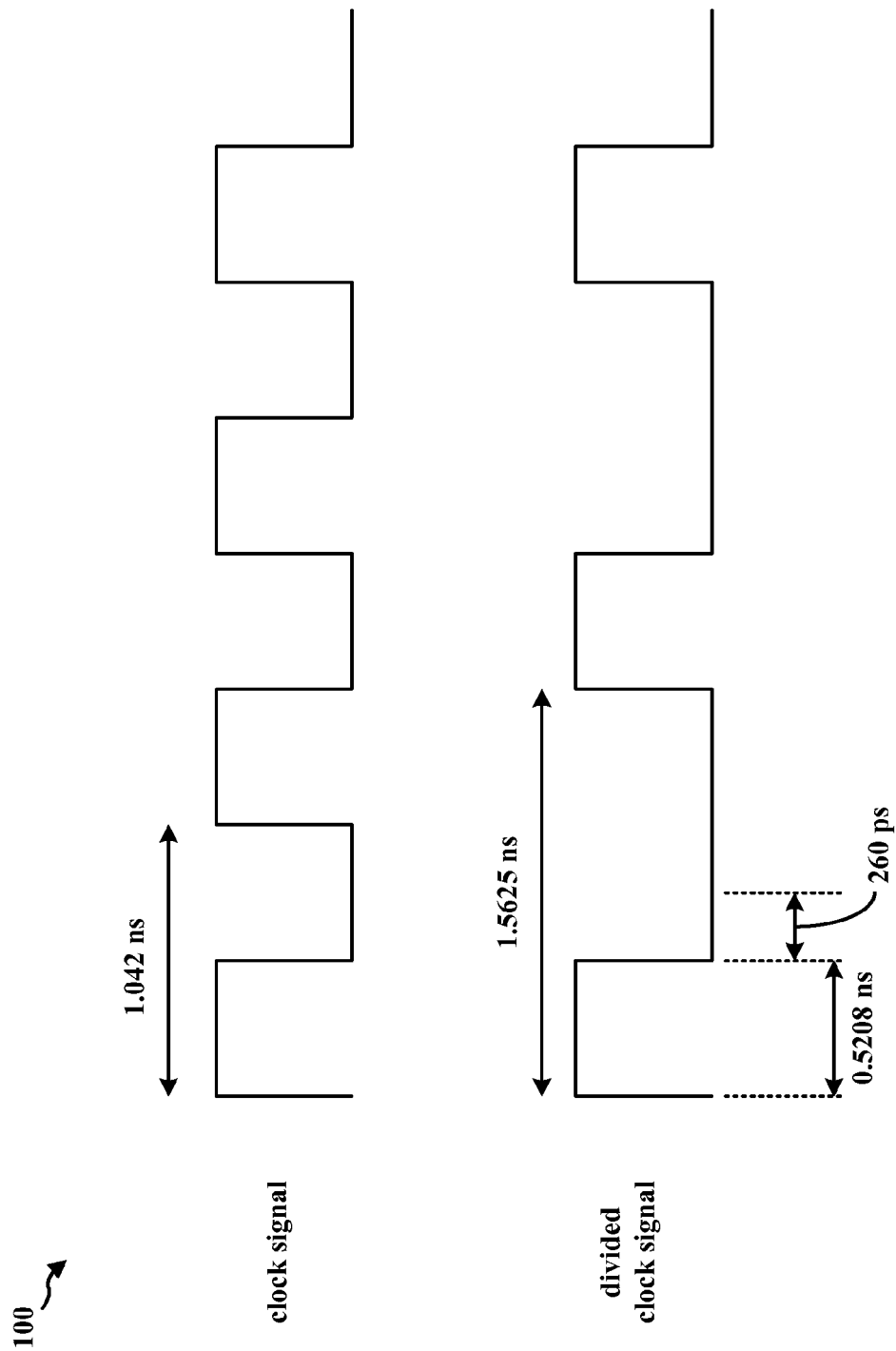
FIG. 1 is a diagram illustrating a clock signal.

FIG. 1 is a diagram 100 illustrating a clock signal. Assume the clock signal has a clock source frequency of 960 MHz. The clock cycle of the clock signal is therefore approximately 1.042 ns. Assume the clock signal is divided by 1.5. The divided clock signal would then have a frequency of 640 MHz, which corresponds to a clock cycle of 1.5625 ns, and which yields a duty cycle of 33%. As such, the divided clock signal would have a pulse width reduction of approximately 260 ps. Assume also that clock tree jitter is 100 ps and PLL jitter is 75 ps. Accordingly, the total clock uncertainty would be 260 ps+100 ps+75 ps=435 ps. A total clock uncertainty of 435 ps is 27.8% of the clock cycle. The pulse width reduction accounts for approximately 60% (260/435) of the total clock uncertainty. With the total clock uncertainty of 435 ps, an element (e.g., a memory) that receives such divided clock signal must account for a minimum pulse width (MPW) as small as approximately 346 ps (i.e., ~521 ps-100 ps-75 ps). By restoring the duty cycle after dividing the clock signal, the clock uncertainty can be reduced to 175 ps and the MPW can be improved to approximately 606 ps. With a clock uncertainty of 175 ps, the total clock uncertainty can be reduced to about 11.2% of the clock cycle. Accordingly, by restoring the duty cycle to approximately 50%, such element may be designed to operate based on an MPW of 606 ps rather than 346 ps. An exemplary clock divider/duty cycle adjustment apparatus for restoring the duty cycle to approximately 50% of a divided clock signal is provided infra with respect to FIG. 2.

Figure 2:
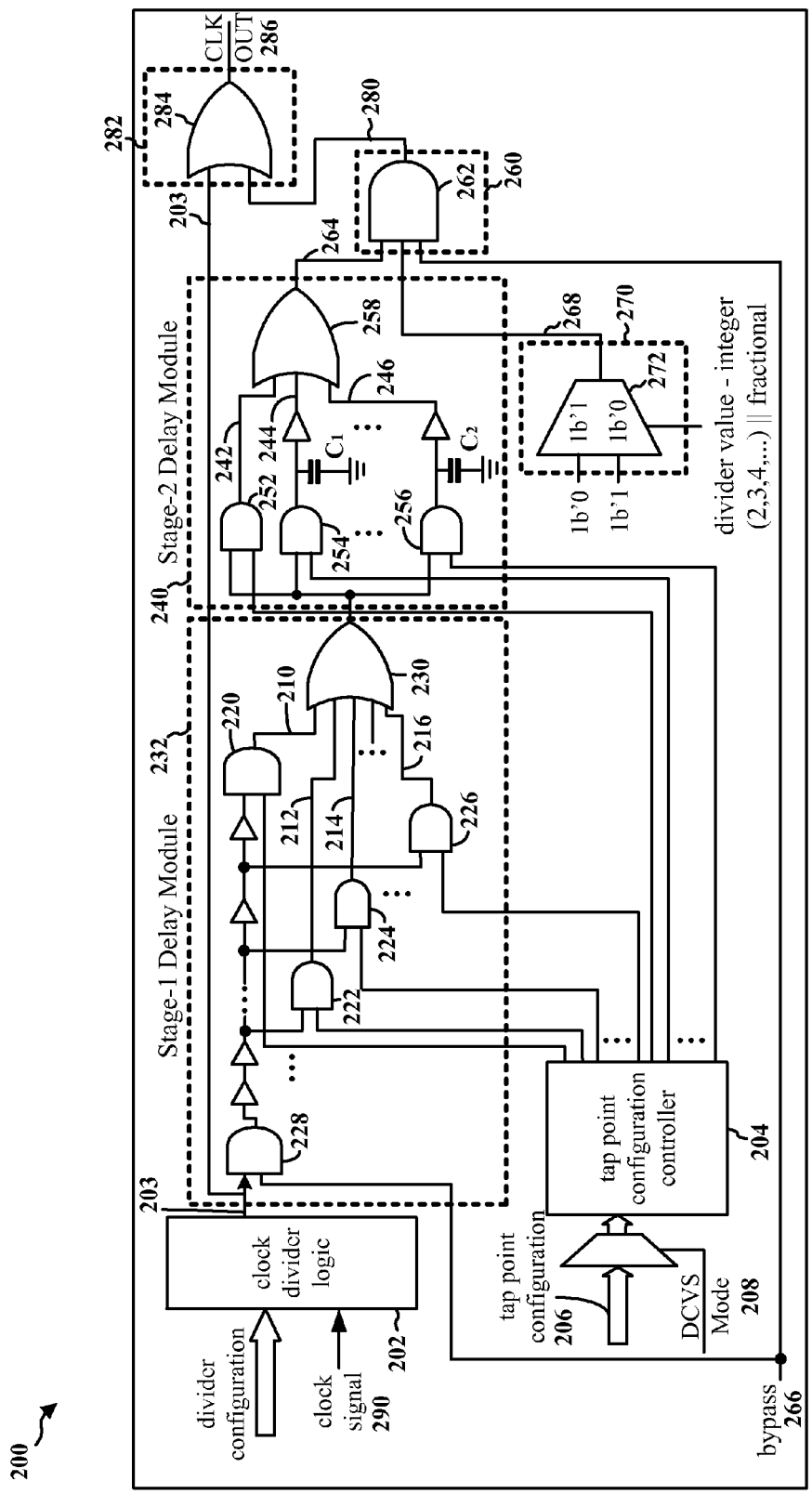
FIG. 2 is a diagram illustrating an exemplary clock divider/duty cycle adjustment apparatus.

FIG. 2 is a diagram illustrating an exemplary clock divider/duty cycle adjustment apparatus 200. The apparatus 200 may include clock divider logic 202 that is configured to divide a received clock signal 290 based on divider configuration information, and to output the divided clock signal 203. The divider configuration information includes a divider value greater than one. In one configuration, the apparatus 200 includes the clock divider logic 202. In another configuration, the apparatus 200 does not include the clock divider logic 202. In such a configuration, the apparatus 200 receives the divided clock signal 203 from clock divider logic external the apparatus 200. The apparatus 200 further includes a tap point configuration controller 204 that is configured to determine tap points for a stage-1 delay module 232 and a stage-2 delay module 240 based on a tap point configuration 206 and a corresponding dynamic clock frequency and voltage scaling (DCVS) mode 208. DCVS modes, which correspond to a supply voltage level and a clock frequency, may include one or more of super turbo mode, turbo mode, normal mode, low voltage mode, and/or ultra-low voltage mode. The tap point configuration 206 includes an IC/SoC temperature and/or the frequency of the clock signal 290. The stage-1 delay module 232 delays the divided clock signal 203 by a smaller fixed (fine grain) delay based on a different number of buffers in each of a set of delay paths of the stage-1 delay module 232, and the stage-2 delay module 240 delays the output of the stage-1 delay module 232 by a larger fixed (course grain) delay based on a capacitance in each of a set of delay paths of the stage-2 delay module 240. The apparatus 200 further includes a bypass module 260, shown to include an AND gate 262, that is configured to receive the delayed divided clock signal 264 from the stage-2 delay module 240, and to output a delayed divided clock signal 280 subject to two different bypass signals 266, 268. The first bypass signal 266 may be used to bypass a duty cycle adjustment of the divided clock signal 203. When the first bypass signal 266 is high, the divided clock signal 203 can propagate through the stage-1 delay module 232 and the stage-2 delay module 240. When the first bypass signal 266 is low, the divided clock signal 203 is prevented (via AND gate 228) from propagating through the stage-1 delay module 232 and the stage-2 delay module 240, and the bypass module 260 is forced to output a low signal. The apparatus 200 further includes an integer/fractional divider value determination module 270, shown to include a multiplexer 272, that outputs a low bypass signal 268 when the divider value is an integer, and a high bypass signal 268 when the divider value is a fractional value. When the divider value is an integer (e.g., 2, 3, 4, . . . ), the duty cycle of the divided clock signal 203 may be approximately 50%, and therefore the integer/fractional divider value determination module 270 may prevent any adjustment of the duty cycle of the divided clock signal 203 by outputting a low signal. However, when the divider value is a fractional value, the duty cycle of the divided clock signal 203 may be less than 50%, and therefore the integer/fractional divider value determination module 270 may allow the adjustment of the duty cycle of the divided clock signal 203 by outputting a high signal.

Referring again to the tap point configuration controller 204, based on the DCVS mode, the IC/SoC temperature, and/or the frequency of the clock signal 290, the tap point configuration controller 204 is configured to determine a pulse width correction $PW_c$ to the divided clock signal 203 from the clock divider logic 202. Based on the determined pulse width correction $PW_c$, the tap point configuration controller 204 is configured to select one or more tap points within the stage-2 delay module 240. The stage-2 delay module 240 includes a plurality of delay paths 242, 244, . . . , 246, each with a different fixed (course grain) delay $d_{21}$, $d_{22}$, . . . , $d_{2n}$. The delay paths 242, 244, . . . , 246 are ORed together by the OR gate 258. The tap point configuration controller 204 is configured to select one or more of the delay paths 242, 244, . . . , 246 by inputting a high signal into one or more of the AND gates 252, 254, . . . , 256, respectively. In one configuration, the tap point configuration controller 204 is configured to select the tap point corresponding to the largest delay $d_{21}$, $d_{22}$, . . . , or $d_{2n}$ (the selected delay being $D_2$) that is less than $PW_c$. Further, based on the determined pulse width correction $PW_c$ and based on the selected delay $D_2$ in the stage-2 delay module 240, the tap point configuration controller 204 is configured to select one or more tap points within the stage-1 delay module 232. The stage-1 delay module 232 includes a plurality of delay paths 210, 212, 214, . . . , 216, each with a different fixed (fine grain) delay $d_{11}$, $d_{12}$, $d_{13}$, . . . , $d_{1m}$. The delay paths 210, 212, 214, . . . , 216 are ORed together by the OR gate 230. The tap point configuration controller 204 is configured to select one or more of the delay paths 210, 212, 214, . . . , 216 by inputting a high signal into one or more of the AND gates 220, 222, 224, . . . , 226, respectively. In one configuration, the tap point configuration controller 204 is configured to select the tap point corresponding to one of the delays $d_{11}$, $d_{12}$, $d_{13}$, . . . , or $d_{1m}$ (the selected delay being $D_1$) such that $D_1 \cong PW_c - D_2$.

As the delays paths 242, 244, . . . , 246 with delays $d_{21}$, $d_{22}$, . . . , $d_{2n}$, respectively, have course grain delay differences, the difference between delays $d_{22}$ and $d_{21}$, $d_{23}$ and $d_{22}$, . . . , $d_{2n}$ and $d_{2-1}$ are greater than a difference between delays $d_{12}$ and $d_{11}$, $d_{13}$ and $d_{12}$, . . . , $d_{1m}$ and $d_{1m-1}$ corresponding to the fine grain delay paths 210, 212, 214, . . . , 216. When the duty cycle of the divided clock signal 203 is greater than 25%, the tap point configuration controller 204 may be configured to select one tap point from the stage-1 delay module 232 and one tap point from the stage-2 delay module 240. However, when the duty cycle of the divided clock signal 203 is less than 25%, the tap point configuration controller 204 may be configured to select two or more tap points in the stage-1 delay module 232 and/or two or more tap points in the stage-2 delay module 240. Accordingly, when the duty cycle of the divided clock signal 203 is less than 25%, the tap point configuration controller 204 may be configured to select additional tap points in the stage-1 delay module 232 corresponding to delays less than $D_1$ and/or to select additional tap points in the stage-2 delay module 232 corresponding to delays less than $D_2$ so as to adjust the pulse duration of the signal 280 ORed with the divided clock signal 203, both of which are input to the duty cycle adjustment module 282. The duty cycle adjustment module 282 receives as input the signal 280 from the bypass module 260 and the divided clock signal 203, and outputs the output clock signal CLK OUT 286. The duty cycle adjustment module 282 may include an OR gate 284 for combining the divided clock signal 203 and delayed divided clock signal 280 together.

Other types of gates may be used in the stage-1 delay module 232, stage-2 delay module 240, bypass module 260, integer/fractional divider value determination module 270, and/or duty cycle adjustment module 282 that provide similar functionality. The apparatus 200 avoids use of an edge detector on the divided clock signal 203 and use of an exclusive OR (XOR) gate when restoring the duty cycle. Instead, the apparatus 200 generates a delayed divided clock signal 280 through the tap point configuration controller 204, and restores the duty cycle by ORing the divided clock signal 203 with the delayed divided clock signal 280. The tap point configuration controller 204 may determine a requisite pulse width adjustment based on an IC/SoC temperature, DCVS mode, and/or frequency of the clock signal 290, and may make course and fine delay adjustments based on delay paths through the stage-2 delay module 240 and the stage-1 delay module 232, respectively.

Figure 3:
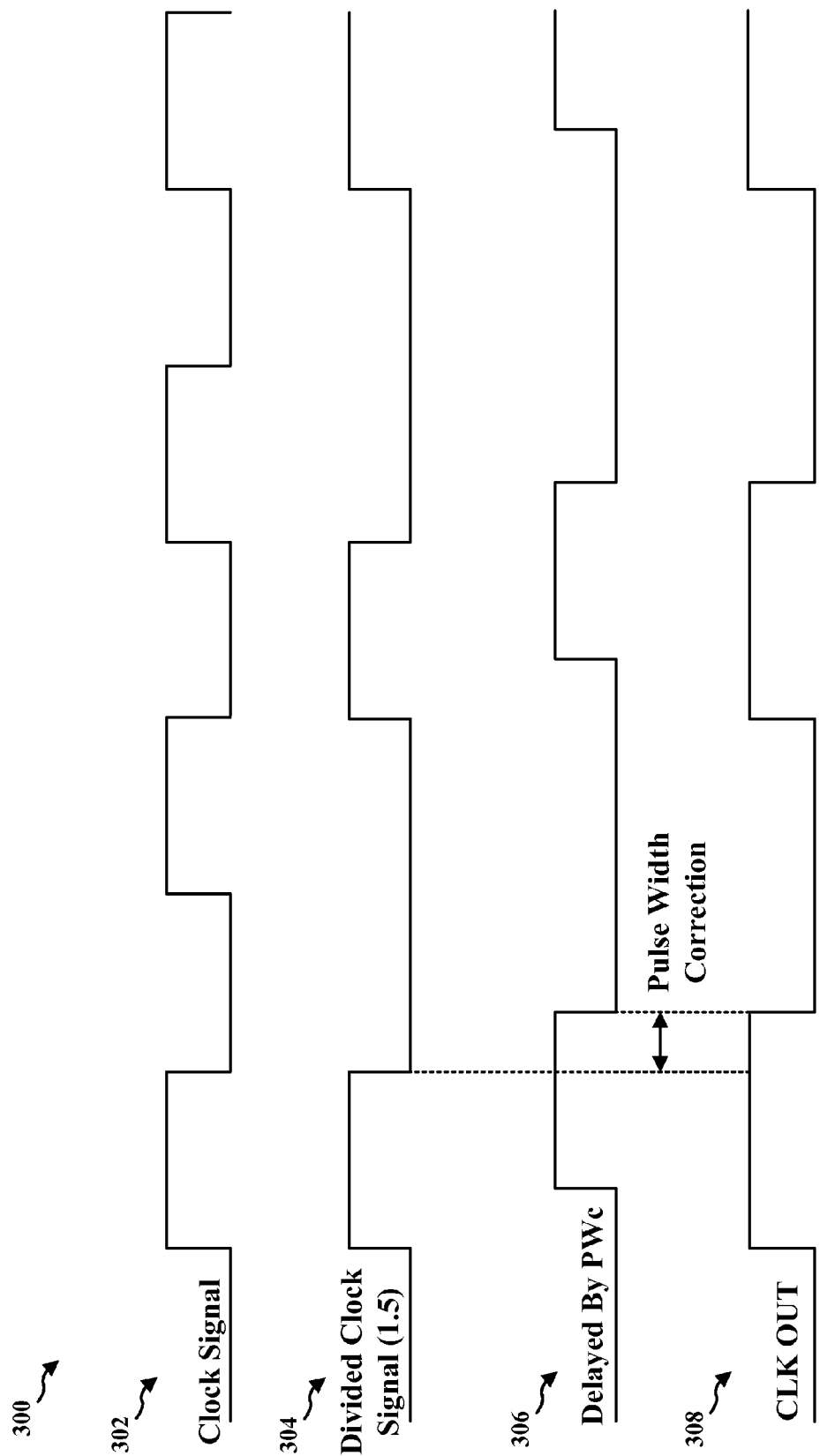
FIG. 3 is a timing diagram associated with the exemplary clock divider/duty cycle adjustment apparatus of FIG. 2.

FIG. 3 is an example timing diagram 300 associated with the exemplary clock divider/duty cycle adjustment apparatus 200 of FIG. 2. A clock signal 302 corresponds to the clock signal 290 of FIG. 2. The clock divider logic 202 divides the received clock signal 302 to generate a divided clock signal 304. The divided clock signal 304 corresponds to the divided clock signal 203 of FIG. 2. In this example, the clock signal 302 is divided by 1.5. With the bypass signals 266, 268 high, the stage-1 delay module 232 and stage-2 delay module 240 delay the divided clock signal 304 to generate a delayed divided clock signal 306. The delayed divided clock signal 306 corresponds to the delayed divided clock signal 264/280. The divided clock signal 304 and the delayed divided clock signal 306 are ORed together to generate the CLK OUT signal 308, which corresponds to the CLK OUT signal 286 of FIG. 2. The CLK OUT signal 308 has a pulse width correction/adjustment with respect to the divided clock signal 304.

Referring again to FIG. 2, a duty cycle adjustment apparatus 200 of an IC includes a duty cycle adjustment determination module 204 configured to determine an adjustment to a duty cycle of a clock signal 203. The apparatus 200 further includes a clock delay module 232, 240 configured to receive the clock signal 203, to delay the clock signal 203 through a first delay stage module 232 and a second delay stage module 240 based on the duty cycle adjustment determined by the duty cycle adjustment determination module 204, and to output the delayed clock signal 264. The first delay stage module 232 includes a first plurality of delay paths 210, 212, 214, . . . , 216. The second delay stage module 240 includes a second plurality of delay paths 242, 244, . . . , 246. The second plurality of delay paths 242, 244, . . . , 246 have a greater delay difference between each of the corresponding delay paths than the first plurality of delay paths 210, 212, 214, . . . , 216. The apparatus 200 further includes a duty cycle adjustment module 282 configured to receive the clock signal 203 and the delayed clock signal 280, to adjust the duty cycle of the clock signal 203 based on the delayed clock signal 280, and to output a duty cycle adjusted clock signal 286. In one configuration, the duty cycle adjustment determination module 204 is configured to determine the adjustment to the duty cycle of the clock signal 203 based on a frequency of the clock signal 203 and at least one of a temperature of the IC or a power supply voltage of the IC. In one configuration, the duty cycle adjustment module 282 is configured to OR the clock signal 203 and the delayed clock signal 280 to generate the duty cycle adjusted clock signal 286. In one configuration, the duty cycle adjustment module 282 includes an OR gate 284 that receives inputs of the clock signal 203 and the delayed clock signal 280, and outputs the duty cycle adjusted clock signal 286.

In one configuration, the duty cycle adjustment determination module 204 is configured to select one or more of a plurality of delayed clock signals within the first delay stage module 232, and the clock delay module 232, 240 is configured to output an OR of the one or more selected delayed clock signals. The plurality of delayed clock signals are delayed by different time periods. In one configuration, the first delay stage module 232 comprises N different delay paths, each with a different number of buffers for providing a different delay through each of the N different delay paths, and the duty cycle adjustment determination module 204 is configured to select one or more of the N different delay paths based on the input from the duty cycle adjustment determination module 204. In one configuration, a number of delay paths selected by the duty cycle adjustment determination module 204 is based on a duty cycle of the delayed clock signal 203. For example, if the duty cycle of the delayed clock signal 203 is greater than 25%, the duty cycle adjustment determination module 204 may select one delay path in the first delay stage module 232. However, if the duty cycle of the delayed clock signal 203 is less than 25%, the duty cycle adjustment determination module 204 may select more than one delay path in the first delay stage module 232. In one configuration, the duty cycle adjustment determination module 204 is configured to determine the adjustment to the duty cycle of the clock signal 203 further based on a largest time delay (e.g., see discussion in relation to $D_1$) through the selected one or more delay paths. In one configuration, each of the N different delay paths includes an AND gate for selecting the delay path, and includes a set of buffers. Each set of buffers includes zero or more buffers for providing different delays through the delay paths. For example, the delay path 212 includes the AND gate 222 and two buffers. In one configuration, the first delay stage module 232 further includes an OR gate 230 with inputs from each of the N different delay paths. In one configuration, the first delay stage module 232 further includes a bypass gate 228 (e.g., AND gate) for preventing propagation of the clock signal 203 through the first delay stage module 232.

In one configuration, the duty cycle adjustment determination module 204 is configured to select one or more of a plurality of delayed clock signals within the second delay stage module 240, and the clock delay module 232, 240 is configured to output an OR of the one or more selected delayed clock signals. The plurality of delayed clock signals are delayed by different time periods. In one configuration, the second delay stage module 240 includes M different delay paths, each with a different capacitance for providing a different delay through each of the M different delay paths, and the duty cycle adjustment determination module 204 is configured to select one or more of the M different delay paths based on the input from the duty cycle adjustment determination module 204. In one configuration, a number of delay paths selected by the duty cycle adjustment determination module 204 is based on a duty cycle of the delayed clock signal 203. For example, if the duty cycle of the delayed clock signal 203 is greater than 25%, the duty cycle adjustment determination module 204 may select one delay path in the second delay stage module 240. However, if the duty cycle of the delayed clock signal 203 is less than 25%, the duty cycle adjustment determination module 204 may select more than one delay path in the second delay stage module 240. In one configuration, the duty cycle adjustment determination module 204 is configured to determine the adjustment to the duty cycle of the clock signal 203 further based on a largest time delay (e.g., see discussion in relation to $D_2$) through the selected one or more delay paths. In one configuration, each of the M different delay paths includes an AND gate for selecting the delay path, and each of a subset of the M different delay paths includes a buffer and a capacitor for providing different delays through the delay paths. For example, the each of the delay paths 242, 244, . . . , 246 includes an AND gate, and each of the delay paths 244 . . . 246 includes a buffer and a different sized capacitor (e.g., $C_1$, $C_2$) for providing different delays through the delay paths. In one configuration, the second delay stage module 240 further includes an OR gate 258 with inputs from each of the M different delay paths.

In one configuration, the apparatus 200 further includes a bypass module 260 coupled between the clock delay module 232, 240 and the duty cycle adjustment module 282. The bypass module 260 is configured to prevent the duty cycle adjustment module 282 from adjusting a duty cycle of the clock signal 203 based on output from the clock delay module 232, 240. In one configuration, the bypass module 260 receives input from an integer/fractional divider value determination module 270.

Figure 4:
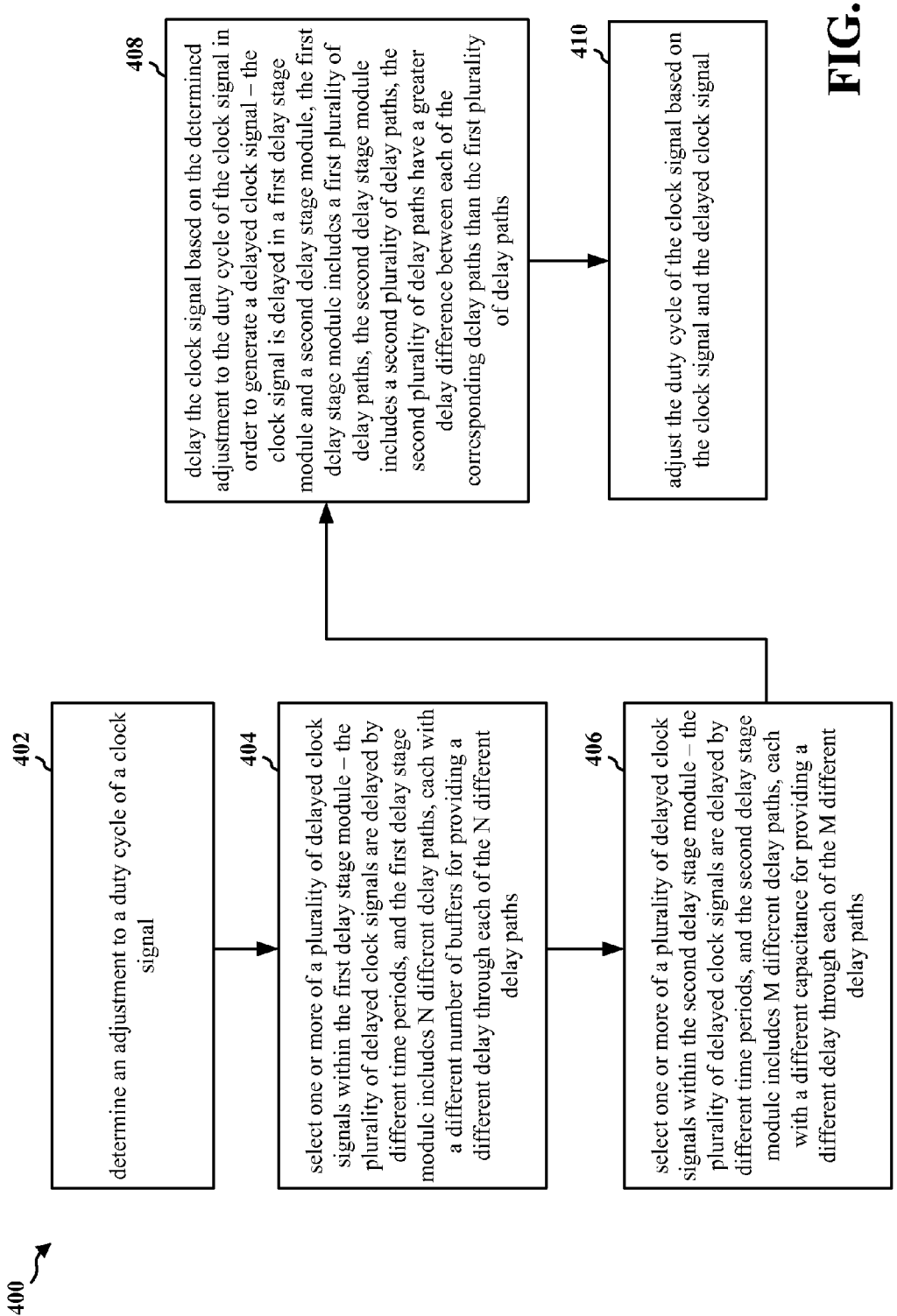
FIG. 4 is a flow chart of an exemplary method of a duty cycle adjustment apparatus.

FIG. 4 is a flow chart 400 of an exemplary method of a clock divider/duty cycle adjustment apparatus of an IC. At 402, the apparatus determines an adjustment to a duty cycle of a clock signal. At 404, the apparatus selects one or more of a plurality of delayed clock signals within the first delay stage module. The plurality of delayed clock signals are delayed by different time periods. The first delay stage module includes N different delay paths each with a different number of buffers for providing a different delay through each of the N different delay paths. At 406, the apparatus delays the clock signal at 404 by selecting one or more of a plurality of delayed clock signals within the second delay stage module. The plurality of delayed clock signals are delayed by different time periods. The second delay stage module includes M different delay paths each with a different capacitance for providing a different delay through each of the M different delay paths. At 408, the apparatus delays the clock signal based on the determined adjustment to the duty cycle of the clock signal in order to generate a delayed clock signal. The clock signal is delayed in a first delay stage module and a second delay stage module. The first delay stage module includes a first plurality of delay paths. The second delay stage module includes a second plurality of delay paths. The second plurality of delay paths have a greater delay difference between each of the corresponding delay paths than the first plurality of delay paths. At 410, the apparatus adjusts the duty cycle of the clock signal based on the clock signal and the delayed clock signal.

In one configuration, the adjustment to the duty cycle of the clock signal is based on a frequency of the clock signal and at least one of a temperature of the IC or a power supply voltage of the IC. In one configuration, the duty cycle of the clock signal is adjusted by ORing the clock signal and the delayed clock signal. In one configuration, a duty cycle adjustment apparatus of an IC includes means for determining an adjustment to a duty cycle of a clock signal. The apparatus further includes means for delaying the clock signal based on the determined adjustment to the duty cycle of the clock signal in order to generate a delayed clock signal. The clock signal is delayed in a first delay stage module and a second delay stage module. The first delay stage module includes a first plurality of delay paths. The second delay stage module includes a second plurality of delay paths. The second plurality of delay paths have a greater delay difference between each of the corresponding delay paths than the first plurality of delay paths. The apparatus further includes means for adjusting the duty cycle of the clock signal based on the clock signal and the delayed clock signal.

In one configuration, the means for adjusting is configured to perform the adjustment to the duty cycle of the clock signal based on a frequency of the clock signal and at least one of a temperature of the IC or a power supply voltage of the IC. In one configuration, the means for adjusting is configured to adjust the duty cycle of the clock signal by ORing the clock signal and the delayed clock signal. In one configuration, the apparatus further includes means for selecting one or more of a plurality of delayed clock signals within the first delay stage module. The plurality of delayed clock signals are delayed by different time periods. The first delay stage module includes N different delay paths, each with a different number of buffers for providing a different delay through each of the N different delay paths. In one configuration, the apparatus further includes means for selecting one or more of a plurality of delayed clock signals within the second delay stage module. The plurality of delayed clock signals are delayed by different time periods. The second delay stage module includes M different delay paths, each with a different capacitance for providing a different delay through each of the M different delay paths.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A duty cycle adjustment apparatus of an integrated circuit (IC), comprising:
    a duty cycle adjustment determination module configured to determine an adjustment to a duty cycle of a clock signal;
    a clock delay module configured to receive the clock signal, to delay the clock signal through a first delay stage module and a second delay stage module based on the duty cycle adjustment determined by the duty cycle adjustment determination module, and to output the delayed clock signal, the first delay stage module comprising a first plurality of delay paths, the second delay stage module comprising a second plurality of delay paths, the second plurality of delay paths having a greater delay difference between each of the corresponding delay paths than the first plurality of delay paths; and
    a duty cycle adjustment module configured to receive the clock signal and the delayed clock signal, to adjust the duty cycle of the clock signal based on the delayed clock signal, and to output a duty cycle adjusted clock signal.

2. The duty cycle adjustment apparatus of claim 1, wherein the duty cycle adjustment determination module is configured to determine the adjustment to the duty cycle of the clock signal based on a frequency of the clock signal and at least one of a temperature of the IC or a power supply voltage of the IC.

3. The duty cycle adjustment apparatus of claim 1, wherein the duty cycle adjustment module is configured to OR the clock signal and the delayed clock signal to generate the duty cycle adjusted clock signal.

4. The duty cycle adjustment apparatus of claim 3, wherein the duty cycle adjustment module comprises an OR gate that receives inputs of the clock signal and the delayed clock signal, and outputs the duty cycle adjusted clock signal.

5. The duty cycle adjustment apparatus of claim 1, wherein the duty cycle adjustment determination module is configured to select one or more of a plurality of delayed clock signals within the first delay stage module, and the clock delay module is configured to output an OR of the one or more selected delayed clock signals, the plurality of delayed clock signals being delayed by different time periods.

6. The duty cycle adjustment apparatus of claim 5, wherein the first delay stage module comprises N different delay paths each with a different number of buffers for providing a different delay through each of the N different delay paths, and the duty cycle adjustment determination module is configured to select one or more of the N different delay paths based on the input from the duty cycle adjustment determination module.

7. The duty cycle adjustment apparatus of claim 6, wherein a number of delay paths selected by the duty cycle adjustment determination module is based on a duty cycle of the delayed clock signal.

8. The duty cycle adjustment apparatus of claim 6, wherein the duty cycle adjustment determination module is configured to determine the adjustment to the duty cycle of the clock signal further based on a largest time delay through the selected one or more delay paths.

9. The duty cycle adjustment apparatus of claim 6, wherein each of the N different delay paths comprises an AND gate for selecting the delay path, and a set of buffers, each set of buffers comprising zero or more buffers for providing different delays through the delay paths.

10. The duty cycle adjustment apparatus of claim 9, wherein each set of buffers includes two or more buffers for providing different delays through the delay paths.

11. The duty cycle adjustment apparatus of claim 6, wherein the first delay stage module further comprises an OR gate with inputs from each of the N different delay paths.

12. The duty cycle adjustment apparatus of claim 6, wherein the first delay stage module further comprises a bypass gate for preventing propagation of the clock signal through the first delay stage module.

13. The duty cycle adjustment apparatus of claim 1, wherein the duty cycle adjustment determination module is configured to select one or more of a plurality of delayed clock signals within the second delay stage module, and the clock delay module is configured to output an OR of the one or more selected delayed clock signals, the plurality of delayed clock signals being delayed by different time periods.

14. The duty cycle adjustment apparatus of claim 13, wherein the second delay stage module comprises M different delay paths each with a different capacitance for providing a different delay through each of the M different delay paths, and the duty cycle adjustment determination module is configured to select one or more of the M different delay paths based on the input from the duty cycle adjustment determination module.

15. The duty cycle adjustment apparatus of claim 14, wherein a number of delay paths selected by the duty cycle adjustment determination module is based on a duty cycle of the delayed clock signal.

16. The duty cycle adjustment apparatus of claim 14, wherein the duty cycle adjustment determination module is configured to determine the adjustment to the duty cycle of the clock signal further based on a largest time delay through the selected one or more delay paths.

17. The duty cycle adjustment apparatus of claim 14, wherein each of the M different delay paths comprises an AND gate for selecting the delay path, and each of a subset of the M different delay paths comprises a buffer and a capacitor for providing different delays through the delay paths.

18. The duty cycle adjustment apparatus of claim 14, wherein the second delay stage module further comprises an OR gate with inputs from each of the M different delay paths.

19. The duty cycle adjustment apparatus of claim 1, further comprising a bypass module coupled between the clock delay module and the duty cycle adjustment module, the bypass module being configured to prevent the duty cycle adjustment module from adjusting a duty cycle of the clock signal based on output from the clock delay module.

20. The duty cycle adjustment apparatus of claim 19, wherein the bypass module receives input from an integer/fractional divider value determination module.

21. A method of a duty cycle adjustment apparatus of an integrated circuit (IC), comprising:
   determining an adjustment to a duty cycle of a clock signal;
   delaying the clock signal based on the determined adjustment to the duty cycle of the clock signal in order to generate a delayed clock signal, the clock signal being delayed in a first delay stage module and a second delay stage module, the first delay stage module comprising a first plurality of delay paths, the second delay stage module comprising a second plurality of delay paths, the second plurality of delay paths having a greater delay difference between each of the corresponding delay paths than the first plurality of delay paths; and
   adjusting the duty cycle of the clock signal based on the clock signal and the delayed clock signal.

22. The method of claim 21, wherein the adjustment to the duty cycle of the clock signal is based on a frequency of the clock signal and at least one of a temperature of the IC or a power supply voltage of the IC.

23. The method of claim 21, wherein the duty cycle of the clock signal is adjusted by ORing the clock signal and the delayed clock signal.

24. The method of claim 21, further comprising selecting one or more of a plurality of delayed clock signals within the first delay stage module, the plurality of delayed clock signals being delayed by different time periods, and wherein the first delay stage module comprises N different delay paths each with a different number of buffers for providing a different delay through each of the N different delay paths.

25. The method of claim 21, further comprising selecting one or more of a plurality of delayed clock signals within the second delay stage module, the plurality of delayed clock signals being delayed by different time periods, and wherein the second delay stage module comprises M different delay paths each with a different capacitance for providing a different delay through each of the M different delay paths.

26. A duty cycle adjustment apparatus of an integrated circuit (IC), comprising:
   means for determining an adjustment to a duty cycle of a clock signal;
   means for delaying the clock signal based on the determined adjustment to the duty cycle of the clock signal in order to generate a delayed clock signal, the clock signal being delayed in a first delay stage module and a second delay stage module, the first delay stage module comprising a first plurality of delay paths, the second delay stage module comprising a second plurality of delay paths, the second plurality of delay paths having a greater delay difference between each of the corresponding delay paths than the first plurality of delay paths; and means for adjusting the duty cycle of the clock signal based on the clock signal and the delayed clock signal.

27. The duty cycle adjustment apparatus of claim 26, wherein the means for adjusting is configured to perform the adjustment to the duty cycle of the clock signal based on a frequency of the clock signal and at least one of a temperature of the IC or a power supply voltage of the IC.

28. The duty cycle adjustment apparatus of claim 26, wherein the means for adjusting is configured to adjust the duty cycle of the clock signal by ORing the clock signal and the delayed clock signal.

29. The duty cycle adjustment apparatus of claim 26, further comprising means for selecting one or more of a plurality of delayed clock signals within the first delay stage module, the plurality of delayed clock signals being delayed by different time periods, and wherein the first delay stage module comprises N different delay paths, each with a different number of buffers for providing a different delay through each of the N different delay paths.

30. The duty cycle adjustment apparatus of claim 26, further comprising means for selecting one or more of a plurality of delayed clock signals within the second delay stage module, the plurality of delayed clock signals being delayed by different time periods, and wherein the second delay stage module comprises M different delay paths, each with a different capacitance for providing a different delay through each of the M different delay paths.

\* \* \* \* \*